United States Patent
Lee

(10) Patent No.: US 10,218,127 B2
(45) Date of Patent: Feb. 26, 2019

(54) PADDLE CARD AND PLUG-CABLE ASSEMBLY

(71) Applicant: VIA Technologies, Inc., New Taipei (TW)

(72) Inventor: Sheng-Yuan Lee, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 98 days.

(21) Appl. No.: 15/640,599

(22) Filed: Jul. 3, 2017

(65) Prior Publication Data

US 2018/0138639 A1    May 17, 2018

Related U.S. Application Data

(60) Provisional application No. 62/422,604, filed on Nov. 16, 2016.

(30) Foreign Application Priority Data

Mar. 3, 2017  (TW) .............................. 106106962 A

(51) Int. Cl.
    *H01R 13/658*  (2011.01)
    *H01R 13/6585* (2011.01)
    (Continued)

(52) U.S. Cl.
    CPC ......... *H01R 13/6585* (2013.01); *H01R 12/53* (2013.01); *H01R 12/722* (2013.01);
    (Continued)

(58) Field of Classification Search
    CPC ............ H01R 13/6585; H01R 13/6588; H01R 12/722; H01R 12/727; H01R 2107/00
    See application file for complete search history.

(56) References Cited

U.S. PATENT DOCUMENTS 7,244,126 B2 * 7/2007 Morana .............. H01R 13/6658
                                                    439/76.1
7,520,757 B2 * 4/2009 Bartholomew ...... H05K 1/0219
                                                    439/76.1

(Continued)

FOREIGN PATENT DOCUMENTS

CN    105742856    7/2016
TW    I553977      10/2016

OTHER PUBLICATIONS

"Office Action of Taiwan Counterpart Application," dated Sep. 15, 2017, p. 1-p. 14.

*Primary Examiner* — Felix O Figueroa
(74) *Attorney, Agent, or Firm* — JCIPRNET

(57) ABSTRACT

A paddle card includes a circuit board, a pad group and first to fourth shielding planes. The circuit board has an upper surface and a lower surface opposite to each other. The pad group is adapted to connect wires of a cable or terminals of a plug, and includes a pair of upper differential pads on the upper surface and a pair of lower differential pads on the lower surface. The pair of upper differential pads is respectively configured corresponding to the pair of lower differential pads in an up and down manner. The first to fourth shielding planes are stacked at intervals between the upper and lower surfaces in sequence. An orthogonal projection of a second opening of the second shielding plane on a geometric plane that a pair of third openings of the third shielding plane is located in is separate from the pair of third openings.

24 Claims, 4 Drawing Sheets

(51) Int. Cl.
*H01R 13/6588* (2011.01)
*H01R 12/53* (2011.01)
*H01R 12/72* (2011.01)
*H01R 24/28* (2011.01)
*H01R 24/60* (2011.01)
*H05K 3/40* (2006.01)
*H01R 107/00* (2006.01)

(52) U.S. Cl.
CPC ....... *H01R 12/727* (2013.01); *H01R 13/6588* (2013.01); *H01R 24/28* (2013.01); *H01R 24/60* (2013.01); *H05K 3/40* (2013.01); *H01R 2107/00* (2013.01)

(56) References Cited

U.S. PATENT DOCUMENTS

| | | | |
|---|---|---|---|
| 9,698,535 B2 * | 7/2017 | Cornelius | H01R 13/665 |
| 2014/0206230 A1 * | 7/2014 | Rost | H01R 9/032 |
| | | | 439/607.01 |
| 2017/0062991 A1 * | 3/2017 | Lee | H01R 13/6591 |

* cited by examiner

| A12 | A11 | A10 | A9 | A8 | A7 | A6 | A5 | A4 | A3 | A2 | A1 |
|---|---|---|---|---|---|---|---|---|---|---|---|
| GND | RX2+ | RX2− | Vbus | SBU1 | D− | D+ | CC | Vbus | TX1− | TX1+ | GND |
|  |  |  |  |  |  |  |  |  |  |  |  |
| GND | TX2+ | TX2− | Vbus | $V_{CONN}$ |  |  | SBU2 | Vbus | RX1− | RX1+ | GND |
| B1 | B2 | B3 | B4 | B5 | B6 | B7 | B8 | B9 | B10 | B11 | B12 |

PADDLE CARD AND PLUG-CABLE ASSEMBLY

CROSS-REFERENCE TO RELATED APPLICATION

This application claims the priority benefits of U.S. provisional application Ser. No. 62/422,604, filed on Nov. 16, 2016 and Taiwan application serial no. 106106962, filed on Mar. 3, 2017. The entirety of each of the above-mentioned patent applications is hereby incorporated by reference herein and made a part of this specification.

BACKGROUND

Field of the Disclosure

The invention relates to a plug cable assembly, and more specifically relates to a paddle card and a plug cable assembly to which the paddle card is applied.

Description of Related Art

In computer devices and portable devices, universal serial bus (herein after USB) interface is the most common interface. When the trend of computer devices and portable devices is towards smaller, thinner, and lighter, and the recently developed USB interface specification "USB Type-C" is widely applied to computer devices and portable devices. USB Type-C is designed to simultaneously meet requirements for advanced use and strengthening. Not only can USB Type-C support the existing USB 2.0, USB 3.1, and USB Power Delivery specification, but USB Type-C also includes more pad lanes and reversible feature. Because of the reversible feature, the circuit board or adaption board used for soldering USB Type-C connector to the cable cannot easily ensure high-speed signal connection, the aforementioned high-speed signal is USB 3.1 Gen 1 (5G bps) or Gen 2 (10G bps) high-speed signal, for example.

SUMMARY

The invention provides a paddle card adapted to connect a cable and a plug of a plug cable assembly in order to increase electrical efficiency.

The invention provides a plug cable assembly, its paddle card is adapted to connect its cable and plug in order to increase electrical efficiency.

A paddle card of the invention is adapted to connect a cable and a plug of a plug cable assembly. A paddle card includes a circuit board, a pad group, a first shielding plane, a second shielding plane, a third shielding plane, and a fourth shielding plane. The circuit board has an upper surface and a lower surface opposite to each other. The pad group is adapted to connect a plurality of wires of the cable or a plurality of terminals of the plug. The pad group includes an upper pad lane and a lower pad lane. The upper pad lane is disposed on the upper surface and includes a pair of first upper differential pads. The lower pad lane is disposed on the lower surface and includes a pair of first lower differential pads. The pair of first upper differential pads is configured corresponding to the pair of first lower differential pads respectively in up and down manner. The first shielding plane, the second shielding plane, the third shielding plane, and the fourth shielding plane are stacked at intervals between the upper and lower surfaces and in sequence from the upper surface to the lower surface. The first shielding plane has a first opening, the second shielding plane has a second opening, the third shielding plane has a pair of third openings, and the fourth shielding plane has a fourth opening. The orthogonal projection of the pair of first upper differential pads on a geometric plane that the first opening is located in overlaps with the first opening, the orthogonal projection of the second opening on the geometric plane that the first opening is located in overlaps with the first opening, the orthogonal projection of the pair of first lower differential pads on a geometric plane that the fourth opening is located in overlaps with the fourth opening, the orthogonal projection of the pair of third openings on the geometric plane that the fourth opening is located in overlaps with the fourth opening, and the orthogonal projection of the second opening on a geometric plane that the pair of third openings is located in is separate from the pair of third openings.

A plug cable assembly of the invention includes a cable, a plug, and a paddle card. The paddle card connects the cable with the plug. A paddle card includes a circuit board, a pad group, a first shielding plane, a second shielding plane, a third shielding plane, and a fourth shielding plane. The circuit board has an upper surface and a lower surface opposite to each other. The pad group is connected to a plurality of wires of the cable or a plurality of terminals of the plug. The pad group includes an upper pad lane and a lower pad lane. The upper pad lane is disposed on the upper surface and includes a pair of first upper differential pads. The lower pad lane is disposed on the lower surface and includes a pair of first lower differential pads. The pair of first upper differential pads is configured corresponding to the pair of first lower differential pads respectively in up and down manner. The first shielding plane, the second shielding plane, the third shielding plane, and the fourth shielding plane are stacked at intervals between the upper and lower surfaces and in sequence from the upper surface to the lower surface. The first shielding plane has a first opening, the second shielding plane has a second opening, the third shielding plane has a pair of third openings, and the fourth shielding plane has a fourth opening. The orthogonal projection of the pair of first upper differential pads on a geometric plane that the first opening is located in overlaps with the ground plane first opening, the orthogonal projection of the second opening on the geometric plane that the first opening is located in overlaps with the first opening, the orthogonal projection of the pair of first lower differential pads on a geometric plane that the fourth opening is located in overlaps with the fourth opening, the orthogonal projection of the pair of third openings on the geometric plane that the fourth opening is located in overlaps with the fourth opening, and the orthogonal projection of the second opening on a geometric plane that the pair of third openings is located in is separate from the pair of third openings.

Based on the above, in the invention, at least one opening is formed on each of the first shielding plane, the second shielding plane, the third shielding plane, and the fourth shielding plane, so as to achieve impedance matching. In addition, the orthogonal projection of the opening of the second shielding plane on a geometric plane that the opening of the third shielding plane is located in is separate from the opening of the third shielding plane, so as to prevent crosstalk between two opposite pairs of differential pads (such as a pair of transmitting differential pads and a pair of receiving differential pads).

In order to make the aforementioned and other features and advantages of the disclosure more comprehensible, embodiments accompanying figures are described in detail belows.

DESCRIPTION OF THE EMBODIMENTS

Figure 1:
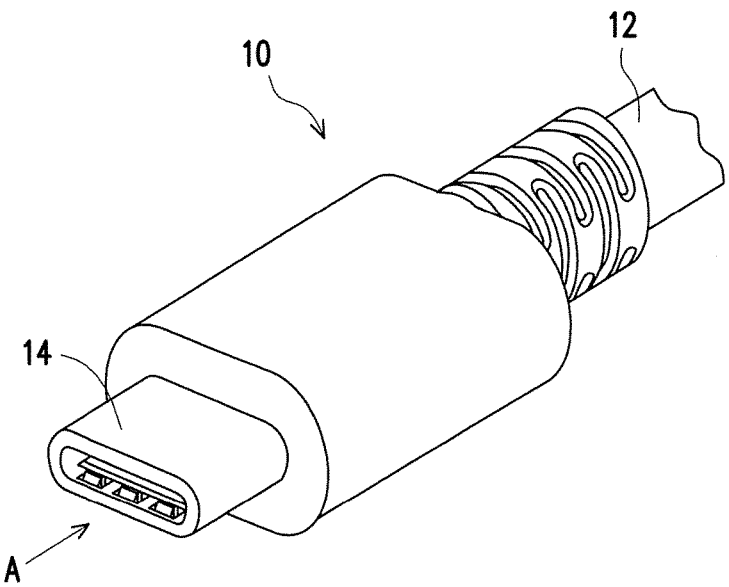
FIG. 1 is a three dimensional view of a plug cable assembly of one embodiment of the invention.
Figure 2:
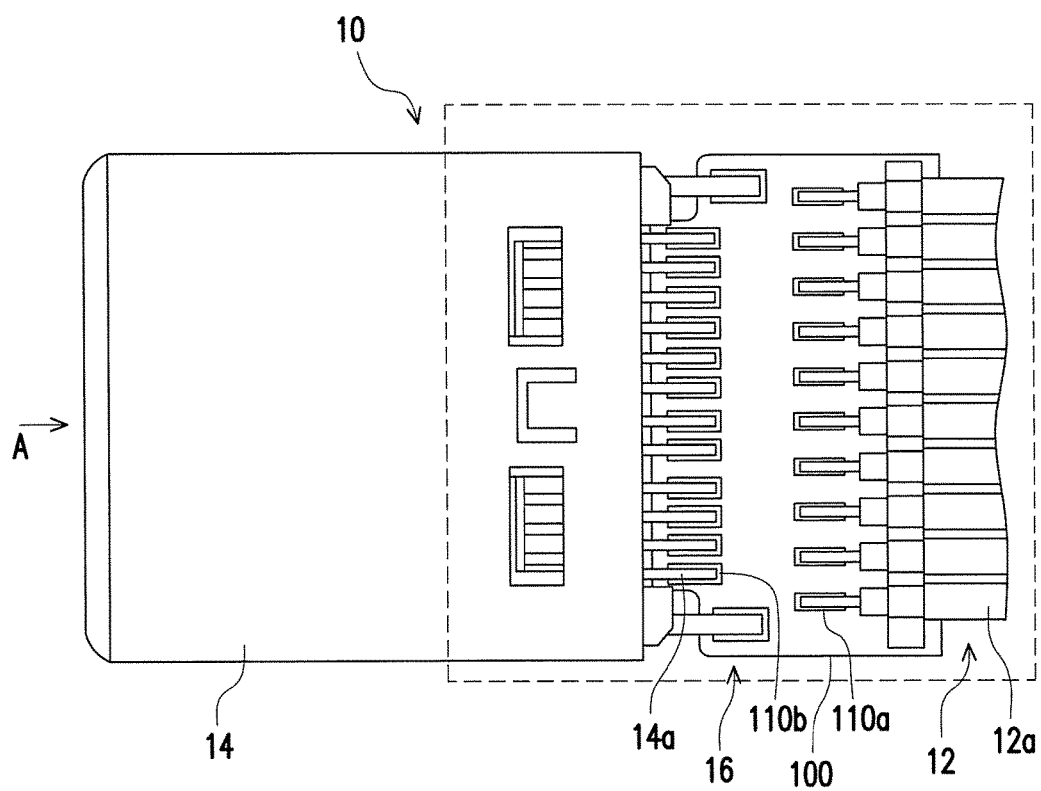
FIG. 2 is a partial top view of the plug cable assembly in FIG. 1.

Referring to FIGS. 1 and 2, in the present embodiment, the plug cable assembly 10 may be a plug cable assembly compliant with USB Type-C interface specification. The plug cable assembly 10 includes a cable 12, a plug 14, and a paddle card 16. The paddle card 16 connects the cable 12 with the plug 14, so that the cable 12 is electrically connected to the plug 14 through the paddle card 16. To be more specific, the paddle card 16 includes a circuit board 100 and a plurality of pads 110a and 110b (the pad 110 in FIG. 4), and the pads 110 are located on two surfaces of the circuit board 100. A plurality of wires 12a of the cable 12 are respectively connected to a plurality of pads 110a of the paddle card 16, and a plurality of terminals 14a of the plug 14 are respectively connected to a plurality of pads 110b of the paddle card 16.

Figures 3, 4:
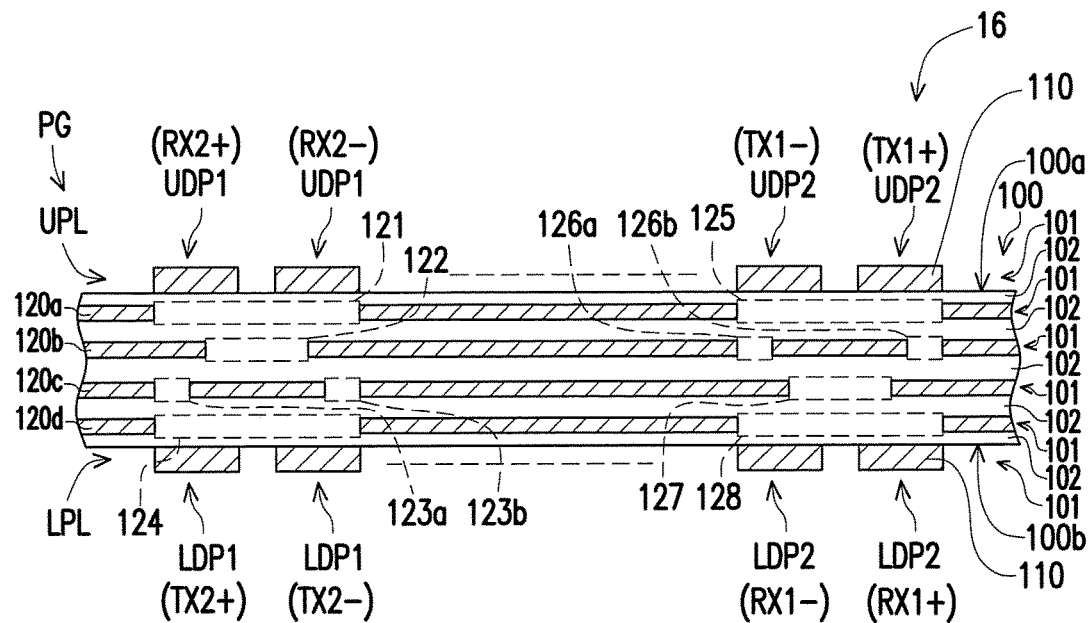
FIG. 3 is a pin arrangement of the plug cable assembly in FIG. 1.
FIG. 4 is a cross-sectional schematic view of a paddle card in FIG. 2.

Referring to FIGS. 1, 2 and 3, in the present embodiment, when the plug cable assembly 10 is compliant with USB Type-C specification, the electrical configuration of the pads 110b, which are adapted to connect to the terminals 14a of the plug 14 as shown in FIG. 2, is shown in FIG. 3, wherein FIGS. 2-3 are figures obtained by viewing along an arrow A in FIG. 1. GND represents ground connection. TX1+ and TX1− represent a transmitting differential pair, RX1+ and RX1− represent a receiving differential pair, TX2+ and TX2− represent another transmitting differential pair, RX2+ and RX2− represent another receiving differential pair, D+ and D− represent the transmitting/receiving differential pair of USB 2.0 specification or older generation. TX transmitting differential pairs and RX receiving differential pairs perform in full-duplex mode, and D transmitting/receiving differential pairs perform in half-duplex mode. Vbus represents power source, CC represents the direction to connect to the cable for establishing signal, SBU1 and SBU2 represent a side-band usage that is defined according to USB specification, and $V_{CONN}$ represents power supply. The detailed description of the USB Type-C specification may be obtained from the official website of the specification makers and drawers. Otherwise, the positions of the receiving differential pairs and the transmitting differential pairs of the pads 110b in FIG. 2 are described as an example, and the invention is not limited thereto.

In another embodiment, when the plug cable assembly 10 is compliant with USB Type-C specification, the electrical configuration of the pads 110a, which are adapted to connect to the wires 12a of the cable 12 as shown in FIG. 2, is similar to the electrical configuration shown in FIG. 3. Referring to FIGS. 2 and 3, there are 10 of the pads 110a located on one of the surfaces of the circuit board 100 and including at least one receiving differential pair and one transmitting differential pair which are equivalent to 4 pads. The other 6 of the pads 110a can adjust type of signal transmission according to requirements. For example, Vbus represents power source, CC represents the direction to connect to the cable for establishing signal, SBU1 and SBU2 represent a side-band usage that is defined according to USB specification, and VCONN represents power supply. The detailed description of the USB Type-C specification may be obtained from the official website of the specification makers and drawers. Otherwise, the positions of the receiving differential pairs and the transmitting differential pairs of the pads 110a in FIG. 2 are described as an example, and the invention is not limited thereto.

Referring to FIG. 4, the paddle card 16 includes a circuit board 100 formed by alternately superimposing a plurality of patterned conductive layers 101 and a plurality of dielectric layers 102 on each other, and the pads 110 are formed by the corresponding outermost patterned conductive layer 101. In the present embodiment, the circuit board 100 of the paddle card 16 is, for example, a sixth-layer board which is a circuit board having sixth patterned conductive layers 101. The circuit board 100 has an upper surface 100a and a lower surface 100b opposite to the upper surface 100a. The paddle card 16 includes a pad group PG and a plurality of shielding plane including a first shielding plane 120a, a second shielding plane 120b, a third shielding plane 120c, and a fourth shielding plane 120d. The pad group PG is formed by a plurality of pads 110b shown in FIG. 2 and adapted to connect a plurality of terminals 14a of the plug 14. The pad group PG includes an upper pad lane UPL and a lower pad lane LPL which are also formed by a plurality of pads 110b. The electrical configuration of the pads 110 of the upper pad lane UPL and the lower pad lane LPL of the pad group PG is compliant with USB TYPE-C specification, as shown in FIG. 3. The first shielding plane 120a, the second shielding plane 120b, the third shielding plane 120c, and the fourth shielding plane 120d may occupy a part of the area of the patterned conductive layers 101. In one embodiment, the first shielding plane 120a may be a ground plane, the second shielding plane 120b may be a power plane, the third shielding plane 120c may be a power plane, and the fourth shielding plane 120d may be a ground plane. Moreover, ground planes, power planes, and signal lines are distributed on the other parts of the area of the patterned conductive layer 101 according to requirements. In another embodiment, the pad group PG is formed by a plurality of pads 110a shown in FIG. 2 which are adapted to connect a plurality of wires 12a of the cable 12, and the configuration of the receiving differential pairs and the transmitting differential pairs of the pads 110a may be the same as the configuration in FIG. 4.

Referring to FIG. 4, the upper pad lane UPL is disposed on the upper surface 100a of the circuit board 100 of the paddle card 16 and includes a pair of first upper differential pads UDP1. The lower pad lane LPL is disposed on the lower surface 100b of the circuit board 100 of the paddle card 16 and includes a pair of first lower differential pads LDP1. The pair of first upper differential pads UDP1 is configured corresponding to the pair of first lower differential pads LDP1 respectively in up and down manner. In one embodiment, the pair of first upper differential pads UDP1 is respectively aligned with the pair of first lower differential pads LDP1, it means that the projections of the two pairs of upper and lower differential pads on the ground plane completely overlap each other, essentially. Certainly, in other embodiments, the projections of the two pairs of upper and lower differential pads on the ground plane partially overlap each other, it means there is an offset part. The first shielding plane 120a, the second shielding plane 120b, the third shielding plane 120c, and the fourth shielding plane 120d are sequentially stacked at intervals between the upper surface 100a and the lower surface 100b. In addition, referring to FIG. 5, take the pair of first upper differential pads UDP1 and the pair of first lower differential pads LDP1 as an example, the first shielding plane 120a, the second shielding plane 120b, the third shielding plane 120c, and the fourth shielding plane 120d are located between the pair of first upper differential pads UDP1 and the pair of first lower differential pads LDP1.

Figure 5:
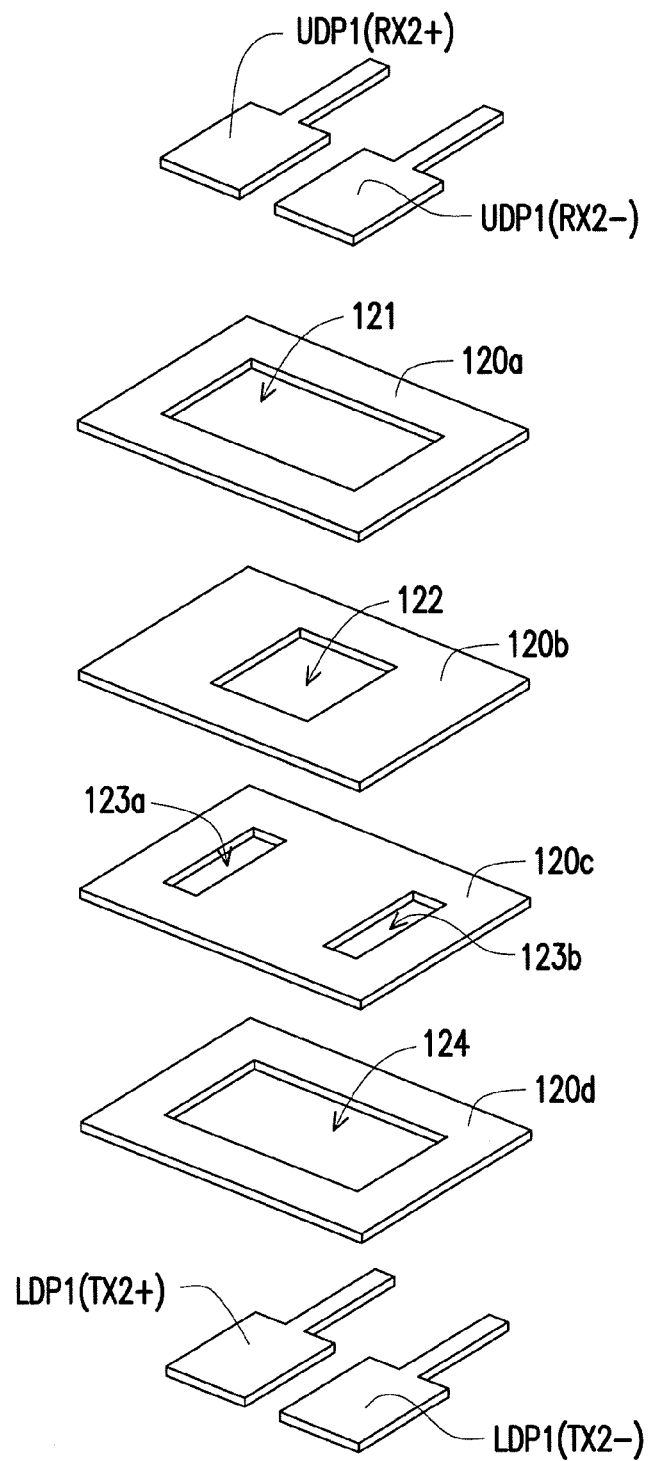
FIG. 5 is partial three dimensional view of a pair of first upper differential pads, a first to fourth shielding planes, and a pair of first lower differential pads of the paddle card in FIG. 4.

Referring to FIGS. 4 and 5, when the pair of first upper differential pads UDP1 is the receiving differential pair RX2+ and RX2− and the pair of first lower differential pads LDP1 is the transmitting differential pair TX2+ and TX2−, the first shielding plane 120a has a first opening 121, the second shielding plane 120b has a second opening 122, the third shielding plane 120c has a pair of third openings 123a and 123b, and the fourth shielding plane 120d has a fourth opening 124. The orthogonal projection of the pair of first upper differential pads UDP1 on a geometric plane that the first opening 121 is located in overlaps with the first opening 121. In the present embodiment, the orthogonal projection of the pair of first upper differential pads UDP1 on a geometric plane that the first opening 121 is located in may be located within the first opening 121 completely. The orthogonal projection of the second opening 122 on the geometric plane that the first opening 121 is located in overlaps with the first opening 121. In the present embodiment, the orthogonal projection of the second opening 122 on the geometric plane that the first opening 121 is located in may be located within the first opening 121 completely. To be more specific, relative to the orthogonal projection of the pair of first upper differential pads UDP1 located at the outer side on the geometric plane that the first opening 121 is located in, the orthogonal projection of the second opening 122 is located at the central area. In the present embodiment, on the geometric plane that the first opening 121 is located in, the orthogonal projection of the differential pad RX2+ of the pair of first upper differential pads UDP1 partially overlaps with the orthogonal projection of the second opening 122, and the orthogonal projection of the other differential pad RX2− of the pair of first upper differential pads UDP1 partially overlaps with the orthogonal projection of the second opening 122. In addition, the orthogonal projection of the pair of first lower differential pads LDP1 on a geometric plane that the fourth opening 124 is located in overlaps with the fourth opening 124. In the present embodiment, the orthogonal projection of the pair of first lower differential pads LDP1 on a geometric plane that the fourth opening 124 is located in may be located within the fourth opening 124 completely. The orthogonal projection of the pair of third openings 123a and 123b on the geometric plane that the fourth opening 124 is located in overlaps with the fourth opening 124. In the present embodiment, the orthogonal projection of the pair of third openings 123a and 123b on the geometric plane that the fourth opening 124 is located in may be located within the fourth opening 124 completely. To be more specific, on the geometric plane that the fourth opening 124 is located in, the orthogonal projection of the third opening 123a is located within the orthogonal projection of the differential pad TX2+ of the pair of first lower differential pads LDP1, and thus these two orthogonal projections overlap. In addition, on the geometric plane that the fourth opening 124 is located in, the orthogonal projection of the third opening 123b is located within the orthogonal projection of the other differential pad TX2− of the pair of first lower differential pads LDP1, and thus these two orthogonal projections overlap.

Otherwise, the orthogonal projection of the second opening 122 on a geometric plane that the pair of third openings 123a and 123b is located in is separate from the pair of third openings 123a and 123b. To be more specific, relative to the orthogonal projection of the pair of third openings 123a and 123b located at the outer side on the geometric plane that the first opening 121 is located in, the orthogonal projection of the second opening 122 is located at the central area. Moreover, on the geometric plane that the first opening 121 is located in, the orthogonal projection of the third opening 123a is located within the orthogonal projection of the differential pad RX2+ of the pair of first upper differential pads UDP1, and thus these two orthogonal projections overlap.

In addition, on the geometric plane that the first opening 121 is located in, the orthogonal projection of the third opening 123b is located within the orthogonal projection of the other differential pad RX2− of the pair of first upper differential pads UDP1, and thus these two orthogonal projections overlap.

Based on above, in the invention, the characteristic impedance coupled between the first shielding plane 120a, the second shielding plane 120b, and the pair of first upper differential pads UDP1 is increased through the first opening 121 and the second opening 122, the characteristic impedance coupled between the third shielding plane 120c, the fourth shielding plane 120d, and the pair of first lower differential pads LDP1 is increased through the pair of third openings 123a and 123b and the fourth opening 124, so as to maintain the impedance matching of the differential signal path as much as possible. Simultaneously, the orthogonal projection of the second opening 122 on the geometric plane that the third openings 123a and 123b is located in is separate from the third openings 123a and 123b. Therefore, a shield is provided between the pair of first upper differential pads UDP1 and the pair of first lower differential pads LDP1, so as to prevent crosstalk between the pair of first upper differential pads UDP1 and the pair of first lower differential pads LDP1.

Referring to FIG. 4, in the present embodiment, the upper pad lane UPL includes a pair of second upper differential pads UDP2, the lower pad lane LPL includes a pair of second lower differential pads LDP2, the pair of second upper differential pads UDP2 are configured corresponding to the pair of second lower differential pads LDP2 respectively in up and down manner. In one embodiment, the pair of second upper differential pads UDP2 is respectively aligned with the pair of second lower differential pads LDP2, it means that the projections of the two pairs of upper and lower differential pads on the ground plane completely overlap each other, essentially. Certainly, in other embodiments, the projections of the two pairs of upper and lower differential pads on the ground plane partially overlap each other, it means there is an offset part. When the pair of second upper differential pads UDP2 includes the transmitting differential pair TX1+ and TX1−, and the pair of second lower differential pads LDP2 includes the receiving differential pair RX1+ and RX1−, the first shielding plane 120a has a fifth opening 125, the second shielding plane 120b has a pair of sixth openings 126a and 126b, the third shielding plane 120c has a seventh opening 127, and the fourth shielding plane 120d has an eighth opening 128. The orthogonal projection of the pair of second lower differential pads LDP2 on a geometric plane that the eighth opening 128 is located in overlaps with the eighth opening 128. In the present embodiment, the orthogonal projection of the pair of second lower differential pads LDP2 on a geometric plane that the eighth opening 128 is located in may be located within the eighth opening 128 completely. The orthogonal projection of the seventh opening 127 on the geometric plane that the eighth opening 128 is located in overlaps with the eighth opening 128. In the present embodiment, the orthogonal projection of the seventh opening 127 on the geometric plane that the eighth opening 128 is located in may be located within the eighth opening 128 completely. To be more specific, relative to the orthogonal projection of the pair of second lower differential pads LDP2 located at the outer side on the geometric plane that the eighth opening 128 is located in, the orthogonal projection of the seventh opening 127 is located at the central area. In the present embodiment, on the geometric plane that the eighth opening 128 is located in, the orthogonal projection of the differential pad RX1+ of the pair of second lower differential pads LDP2 partially overlaps with the orthogonal projection of the seventh opening 127, and the orthogonal projection of the other differential pad RX1− of the pair of second lower differential pads LDP2 partially overlaps with the orthogonal projection of the seventh opening 127.

In addition, the orthogonal projection of the pair of second upper differential pads UDP2 on a geometric plane that the fifth opening 125 is located in overlaps with the fifth opening 125. In the present embodiment, the orthogonal projection of the pair of second upper differential pads UDP2 on the geometric plane that the fifth opening 125 is located in may be located within the fifth opening 125 completely. The orthogonal projection of the pair of sixth openings 126a and 126b on the geometric plane that the fifth opening 125 is located in overlaps with the fifth opening 125. In the present embodiment, the orthogonal projection of the pair of sixth openings 126a and 126b on the geometric plane that the fifth opening 125 is located in may be located within the fifth opening 125 completely. To be more specific, on the geometric plane that the fifth opening 125 is located in, the orthogonal projection of the sixth opening 126a is located within the orthogonal projection of the differential pad TX1− of the pair of second upper differential pads UDP2, and thus these two orthogonal projections overlap. In addition, on the geometric plane that the fifth opening 125 is located in, the orthogonal projection of the sixth opening 126b is located within the orthogonal projection of the other differential pad TX1+ of the pair of second upper differential pads UDP2, and thus these two orthogonal projections overlap.

Otherwise, the orthogonal projection of the seventh opening 127 on the geometric plane that the pair of sixth openings 126a and 126b is located in is separate from the pair of sixth openings 126a and 126b. To be more specific, relative to the orthogonal projection of the pair of sixth openings 126a and 126b located at the outer side on the geometric plane that the eighth opening 128 is located in, the orthogonal projection of the seventh opening 127 is located at the central area. Moreover, on the geometric plane that the eighth opening 128 is located in, the orthogonal projection of the sixth opening 126a is located within the orthogonal projection of the differential pad RX1− of the pair of second lower differential pads LDP2, and thus these two orthogonal projections overlap. In addition, on the geometric plane that the eighth opening 128 is located in, the orthogonal projection of the sixth opening 126b is located within the orthogonal projection of the other differential pad RX1+ of the pair of second lower differential pads LDP2, and thus these two orthogonal projections overlap.

Figure 6:
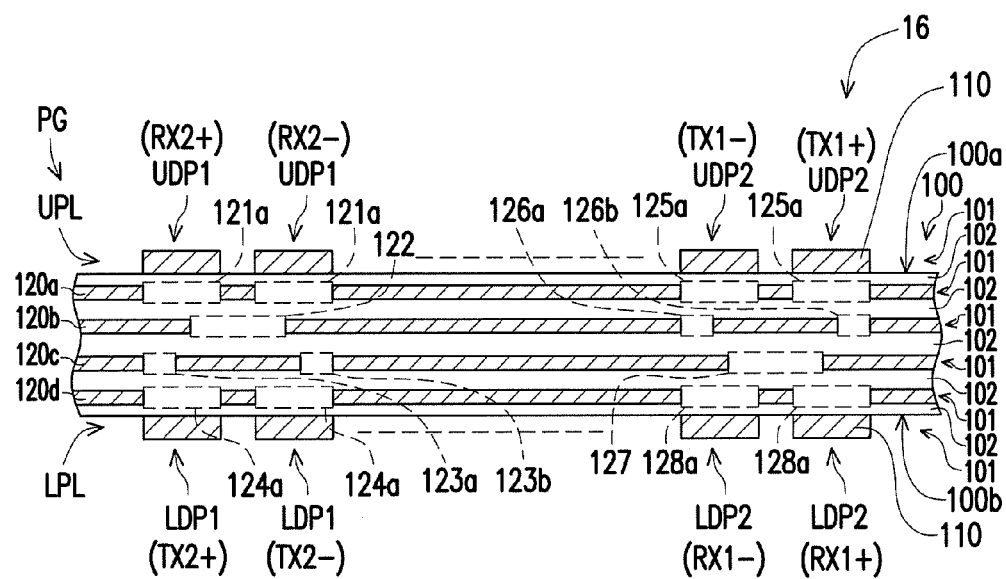
FIG. 6 is a cross-sectional schematic view of a paddle card of another embodiment of the invention.

Referring to an embodiment in FIG. 6, compared to the embodiment in FIG. 4, the first opening 121 includes a pair of first sub-openings 121a, and the orthogonal projection of the pair of first upper differential pads UDP1 on a geometric plane that the first sub-openings 121a are located in overlaps with the first sub-openings 121a respectively. Similarly, the fourth opening 124 includes a pair of fourth sub-openings 124a, and the orthogonal projection of the pair of second lower differential pads LDP2 on a geometric plane that the fourth sub-openings 124a are located in overlaps with the fourth sub-openings 124a respectively. The corresponding relation between the pair of first sub-openings 121a and other components or openings is the same as the corresponding relation between the first opening 121 and other components or openings, and the corresponding relation between the fourth sub-openings 124a and other components and openings is the same as the corresponding relation between the fourth opening 124 and other components or openings.

Similarly, the fifth opening 125 includes a pair of fifth sub-openings 125a, and the orthogonal projection of the pair of second upper differential pads UDP2 on a geometric plane that the fifth sub-openings 125a are located in overlaps with the fifth sub-openings 121a respectively. Similarly, the eight opening 128 includes a pair of eight sub-openings 128a, and the orthogonal projection of the pair of second lower differential pads LDP2 on a geometric plane that the eight sub-openings 128a are located in overlaps with the eight sub-openings 128a respectively. The corresponding relation between the pair of fifth sub-openings 125a and other components or openings is the same as the corresponding relation between the fifth opening 125 and other components or openings, and the corresponding relation between the eight sub-openings 128a and other components and openings is the same as the corresponding relation between the eight opening 128 and other components or openings.

The term "upper" or "lower" as aforementioned is only used to describe the difference between the elements, but the differential pads and the differential signal passing through the differential pads of the invention are not limited thereto.

In summary, in the invention, at least one opening is formed on each of the first shielding plane, the second shielding plane, the third shielding plane, and the fourth shielding plane, so as to achieve impedance matching. In addition, the orthogonal projection of the opening of the second shielding plane on a geometric plane that the opening of the third shielding plane is located in is separate from with the opening of the third shielding plane, so as to prevent crosstalk between two opposite pairs of differential pads (such as a pair of transmitting differential pads and a pair of receiving differential pads). In the manufacturing process, the opening only needs being simultaneously formed when the shielding plane is formed and none of additional manufacturing steps is added, therefore, the manufacturing cost will not be increased.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A paddle card, adapted to connect a cable and a plug of a plug cable assembly, comprising:
   a circuit board, having an upper surface and a lower surface opposite to each other;
   a pad group, adapted to connect a plurality of wires of the cable or a plurality of terminals of the plug, comprising:
   an upper pad lane, disposed on the upper surface and comprising a pair of first upper differential pads; and
   a lower pad lane, disposed on the lower surface and comprising a pair of first lower differential pads, wherein the pair of upper differential pads is configured corresponding to the pair of lower differential pads respectively in an up and down manner; and
   a first shielding plane, a second shielding plane, a third shielding plane, and a fourth shielding plane, stacked at intervals between the upper and lower surfaces in sequence, wherein the first shielding plane has a first opening, the second shielding plane has a second opening, the third shielding plane has a pair of third openings, the fourth shielding plane has a fourth opening, an orthogonal projection of the pair of first upper differential pads on a geometric plane that the first opening is located in overlaps with the first opening, an orthogonal projection of the second opening on the geometric plane that the first opening is located in overlaps with the first opening, an orthogonal projection of the pair of first lower differential pads on a geometric plane that the fourth opening is located in overlaps with the fourth opening, an orthogonal projection of the pair of third openings on the geometric plane that the fourth opening is located in overlaps with the fourth opening, and an orthogonal projection of the second opening on a geometric plane that the pair of third openings is located in is separate from the pair of third openings.

2. The paddle card as recited in claim 1, wherein the first opening comprises a pair of first sub-openings, and the orthogonal projection of the pair of first upper differential pads on the geometric plane that the first sub-openings are located in overlaps with the first sub-openings respectively.

3. The paddle card as recited in claim 1, wherein the fourth opening comprises a pair of fourth sub-openings, and the orthogonal projection of the pair of first lower differential pads on the geometric plane that the fourth sub-openings are located in overlaps with the fourth sub-openings respectively.

4. The paddle card as recited in claim 1, wherein the upper pad lane comprises a pair of second upper differential pads on a side of the pair of first upper differential pads, the lower pad lane comprises a pair of second lower differential pads on a side of the pair of first lower differential pads, the pair of second upper differential pads is configured corresponding to the pair of second lower differential pads respectively in an up and down manner, the first shielding plane has a fifth opening, the second shielding plane has a pair of sixth openings, the third shielding plane has a seventh opening, the fourth shielding plane has an eighth opening, an orthogonal projection of the pair of second lower differential pads on a geometric plane that the eighth opening is located in overlaps with the eighth opening, an orthogonal projection of the seventh opening on the geometric plane that the eighth opening is located in overlaps with the eighth opening, an orthogonal projection of the pair of second upper differential pads on a geometric plane that the fifth opening is located in overlaps with the fifth opening, an orthogonal projection of the pair of sixth openings on the geometric plane that the fifth opening is located in overlaps with the fifth opening, and an orthogonal projection of the seventh opening on a geometric plane that the pair of sixth openings is located in is separate from the pair of sixth openings.

5. The paddle card as recited in claim 4, wherein the fifth opening comprises a pair of fifth sub-openings, and the orthogonal projection of the pair of second upper differential pads on a geometric plane that the fifth sub-openings are located in overlaps with the fifth sub-openings respectively.

6. The paddle card as recited in claim 4, wherein the eighth opening comprises a pair of eighth sub-openings, and the orthogonal projection of the pair of second lower differential pads on a geometric plane that the eighth sub-openings are located in overlaps with the eighth sub-openings respectively.

7. The paddle card as recited in claim 1, wherein the pair of first upper differential pads is a receiving differential pair, and the pair of first lower differential pads is a transmitting differential pair.

8. The paddle card as recited in claim 1, wherein the pair of first upper differential pads completely overlaps with the pair of first lower differential pads, respectively.

9. The paddle card as recited in claim 1, wherein the pair of first upper differential pads partially overlaps with the pair of first lower differential pads, respectively.

10. The paddle card as recited in claim 1, wherein the first shielding plane is a ground plane, the second shielding plane is a power plane, the third shielding plane is a power plane, and the fourth shielding plane is a ground plane.

11. A plug cable assembly, comprising:
    a cable;
    a plug; and
    a paddle card, connecting the cable with the plug, and comprising:
    a circuit board, having an upper surface and a lower surface opposite to each other;
    a pad group, connected to a plurality of wires of the cable, comprising:
    an upper pad lane, disposed on the upper surface and comprising a pair of first upper differential pads; and
    a lower pad lane, disposed on the lower surface and comprising a pair of first lower differential pads, wherein the pair of upper differential pads is configured corresponding to the pair of lower differential pads respectively in an up and down manner; and
    a first shielding plane, a second shielding plane, a third shielding plane, and a fourth shielding plane, stacked at intervals between the upper and lower surfaces in sequence, wherein the first shielding plane has a first opening, the second shielding plane has a second opening, the third shielding plane has a pair of third openings, the fourth shielding plane has a fourth opening, an orthogonal projection of the pair of first upper differential pads on a geometric plane that the first opening is located in overlaps with the first opening, an orthogonal projection of the second opening on the geometric plane that the first opening is located in overlaps with the first opening, an orthogonal projection of the pair of first lower differential pads on a geometric plane that the fourth opening is located in overlaps with the fourth opening, an orthogonal projection of the pair of third openings on the geometric plane that the fourth opening is located in overlaps with the fourth opening, and an orthogonal projection of the second opening on a geometric plane that the pair of third openings is located in is separate from the pair of third openings.

12. The plug cable assembly as recited in claim 11, wherein the first opening comprises a pair of first sub-openings, and the orthogonal projection of the pair of first upper differential pads on a geometric plane that the first sub-openings are located in overlaps with the first sub-openings respectively.

13. The plug cable assembly as recited in claim 11, wherein the fourth opening comprises a pair of fourth sub-openings, and the orthogonal projection of the pair of first lower differential pads on a geometric plane that the fourth sub-openings are located in overlaps with the fourth sub-openings respectively.

14. The plug cable assembly as recited in claim 11, wherein the upper pad lane comprises a pair of second upper differential pads on a side of the pair of first upper differential pads, the lower pad lane comprises a pair of second lower differential pads on a side of the pair of first lower differential pads, the pair of second upper differential pads is configured corresponding to the pair of second lower differential pads respectively in an up and down manner, the first shielding plane has a fifth opening, the second shielding plane has a pair of sixth openings, the third shielding plane has a seventh opening, the fourth shielding plane has an eighth opening, an orthogonal projection of the pair of second lower differential pads on a geometric plane that the eighth opening is located in overlaps with the eighth opening, an orthogonal projection of the seventh opening on the geometric plane that the eighth opening is located in overlaps with the eighth opening, an orthogonal projection of the pair of second upper differential pads on a geometric plane that the fifth opening is located in overlaps with the fifth opening, an orthogonal projection of the pair of sixth openings on the geometric plane that the fifth opening is located in overlaps with the fifth opening, and an orthogonal projection of the seventh opening on a geometric plane that the pair of sixth openings is located in is separate from the pair of sixth openings.

15. The plug cable assembly as recited in claim 14, wherein the fifth opening comprises a pair of fifth sub-openings, and the orthogonal projection of the pair of second upper differential pads on a geometric plane that the fifth sub-openings are located in overlaps with the fifth sub-openings respectively.

16. The plug cable assembly as recited in claim 14, wherein the eighth opening comprises a pair of eighth sub-openings, and the orthogonal projection of the pair of second lower differential pads on a geometric plane that the eighth sub-openings is located in overlaps with the eighth sub-openings respectively.

17. The plug cable assembly as recited in claim 11, wherein the pair of first upper differential pads is a receiving differential pair, and the pair of first lower differential pads is a transmitting differential pair.

18. A plug cable assembly, comprising:
a cable;
a plug; and
a paddle card, connecting the cable with the plug, and comprising:
a circuit board, having an upper surface and a lower surface opposite to each other;
a pad group, connected to a plurality of terminals of the plug, comprising:
an upper pad lane, disposed on the upper surface and comprising a pair of first upper differential pads; and
a lower pad lane, disposed on the lower surface and comprising a pair of first lower differential pads, wherein the pair of upper differential pads is configured corresponding to the pair of lower differential pads respectively in an up and down manner; and
a first shielding plane, a second shielding plane, a third shielding plane, and a fourth shielding plane, stacked at intervals between the upper and lower surfaces in sequence, wherein the first shielding plane has a first opening, the second shielding plane has a second opening, the third shielding plane has a pair of third openings, the fourth shielding plane has a fourth opening, an orthogonal projection of the pair of first upper differential pads on a geometric plane that the first opening is located in overlaps with the first opening, an orthogonal projection of the second opening on the geometric plane that the first opening is located in overlaps with the first opening, an orthogonal projection of the pair of first lower differential pads on a geometric plane that the fourth opening is located in overlaps with the fourth opening, an orthogonal projection of the pair of third openings on the geometric plane that the fourth opening is located in overlaps with the fourth opening, and an orthogonal projection of the second opening on a geometric plane that the pair of third openings is located in is separate from the pair of third openings.

19. The plug cable assembly as recited in claim 18, wherein the first opening comprises a pair of first sub-openings, and the orthogonal projection of the pair of first upper differential pads on the geometric plane that the first sub-openings are located in overlaps with the first sub-openings respectively.

20. The plug cable assembly as recited in claim 18, wherein the fourth opening comprises a pair of fourth sub-openings, and the orthogonal projection of the pair of first lower differential pads on the geometric plane that the fourth sub-openings are located in overlaps with the fourth sub-openings respectively.

21. The plug cable assembly as recited in claim 18, wherein the upper pad lane comprises a pair of second upper differential pads on a side of the pair of first upper differential pads, the lower pad lane comprises a pair of second lower differential pads on a side of the pair of first lower differential pads, the pair of second upper differential pads is configured corresponding to the pair of second lower differential pads respectively in an up and down manner, the first shielding plane has a fifth opening, the second shielding plane has a pair of sixth openings, the third shielding plane has a seventh opening, the fourth shielding plane has an eighth opening, an orthogonal projection of the pair of second lower differential pads on a geometric plane that the eighth opening is located in overlaps with the eighth opening, an orthogonal projection of the seventh opening on the geometric plane that the eighth opening is located in overlaps with the eighth opening, an orthogonal projection of the pair of second upper differential pads on a geometric plane that the fifth opening is located in overlaps with the fifth opening, an orthogonal projection of the pair of sixth openings on the geometric plane that the fifth opening is located in overlaps with the fifth opening, and an orthogonal projection of the seventh opening on a geometric plane that the pair of sixth openings is located in is separate from the pair of sixth openings.

22. The plug cable assembly as recited in claim 21, wherein the fifth opening comprises a pair of fifth sub-openings, and the orthogonal projection of the pair of second upper differential pads on a geometric plane that the fifth sub-openings are located in overlaps with the fifth sub-openings respectively.

23. The plug cable assembly as recited in claim 21, wherein the eighth opening comprises a pair of eighth sub-openings, and the orthogonal projection of the pair of second lower differential pads on a geometric plane that the eighth sub-openings is located in overlaps with the eighth sub-openings respectively.

24. The plug cable assembly as recited in claim 18, wherein the pair of first upper differential pads is a receiving differential pair, and the pair of first lower differential pads is a transmitting differential pair.

* * * * *